(12) United States Patent
Hoentschel et al.

(10) Patent No.: US 9,425,318 B1
(45) Date of Patent: Aug. 23, 2016

(54) INTEGRATED CIRCUITS WITH FETS HAVING NANOWIRES AND METHODS OF MANUFACTURING THE SAME

(71) Applicant: GLOBALFOUNDRIES, Inc., Grand Cayman (KY)

(72) Inventors: Jan Hoentschel, Dresden (DE); Stefan Flachowsky, Dresden (DE); Gerd Zschaetzsch, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/633,351

(22) Filed: Feb. 27, 2015

(51) Int. Cl.
| | |
|---|---|
| H01L 21/324 | (2006.01) |
| H01L 29/66 | (2006.01) |
| H01L 29/78 | (2006.01) |
| H01L 29/161 | (2006.01) |
| H01L 29/06 | (2006.01) |
| H01L 21/02 | (2006.01) |
| H01L 27/108 | (2006.01) |
| H01L 29/423 | (2006.01) |
| H01L 27/092 | (2006.01) |
| H01L 29/417 | (2006.01) |
| H01L 27/088 | (2006.01) |
| H01L 21/8234 | (2006.01) |
| H01L 21/84 | (2006.01) |
| H01L 21/8238 | (2006.01) |

(52) U.S. Cl.
CPC ..... *H01L 29/7851* (2013.01); *H01L 21/02164* (2013.01); *H01L 21/02238* (2013.01); *H01L 21/02532* (2013.01); *H01L 21/324* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/10826* (2013.01); *H01L 27/10879* (2013.01); *H01L 29/0676* (2013.01); *H01L 29/161* (2013.01); *H01L 29/41791* (2013.01); *H01L 29/42392* (2013.01); *H01L 29/6681* (2013.01); *H01L 29/66795* (2013.01); *H01L 29/785* (2013.01); *H01L 29/7843* (2013.01)

(58) Field of Classification Search
None
See application file for complete search history.

(56) References Cited

U.S. PATENT DOCUMENTS

| | | | |
|---|---|---|---|
| 2014/0175543 A1* | 6/2014 | Glass | H01L 21/823431 257/337 |
| 2014/0273423 A1* | 9/2014 | Fronheiser | H01L 29/42392 438/585 |
| 2015/0206875 A1* | 7/2015 | Lee | H01L 27/0886 257/192 |
| 2015/0318176 A1* | 11/2015 | Qi | H01L 21/26513 438/283 |
| 2016/0064526 A1* | 3/2016 | Jacob | H01L 29/66795 438/492 |

* cited by examiner

*Primary Examiner* — Minh-Loan Tran
(74) *Attorney, Agent, or Firm* — Ingrassia Fisher & Lorenz, P.C.

(57) ABSTRACT

Integrated circuits and methods for producing the same are provided. A method for producing an integrated circuit includes forming a stack overlying a substrate. The stack includes a silicon germanium layer and a silicon layer, where the silicon germanium layer has a first germanium concentration. The stack is condensed to produce a second germanium concentration in the germanium layer, where the second germanium concentration is greater than the first germanium concentration. A fin is formed that includes the stack, and a gate is formed overlying the fin.

19 Claims, 9 Drawing Sheets

INTEGRATED CIRCUITS WITH FETS HAVING NANOWIRES AND METHODS OF MANUFACTURING THE SAME

TECHNICAL FIELD

The technical field generally relates to integrated circuits and methods for manufacturing integrated circuits, and more particularly relates to integrated circuits with FETs having nanowires and methods of manufacturing such integrated circuits.

BACKGROUND

The majority of present day integrated circuits (ICs) are implemented by using a plurality of interconnected field effect transistors (FETs), also called metal oxide semiconductor field effect transistors (MOSFETs or MOS transistors). A FET includes a gate electrode as a control electrode overlying a semiconductor channel and spaced-apart source and drain regions on opposite sides of the channel between which a current can flow. A gate dielectric layer is disposed between the gate electrode and the channel to electrically isolate the gate electrode from the channel. A control voltage applied to the gate electrode controls the flow of current through the channel between the source and drain regions. The FETs are generally "N" or "P" type FETs, ("nFET" or "pFET") where the source and drain for nFETs are implanted with "N" type dopants, and the source and drain for pFETs are implanted with "P" type dopants.

A number of challenges arise as feature sizes of FETs and integrated circuits get smaller. For example, significant downsizing of traditional planar FETs leads to electrostatic issues and electron mobility degradation. Scaled-down planar FETS have shorter gate lengths that make it more difficult to control the channel. New device architectures such as nanowires allow further scaling of the integrated circuits, in part because the gate wraps around the channel and provides better control with lower leakage current, faster operations, and lower output resistance. The "gate all around" structure of a FET with nanowires has advantageous short channel characteristics over the electrostatics that the conventional planar FETs or FinFETs provide. Multiple nanowires can be used in the gate of a FET to increase the current capacity. However, there are process challenges in enabling large scale fabrication of nanowire FETs because of the size and structure. Hence nanowire FETs have not been incorporated into current commercial integrated circuit manufacturing.

Accordingly, it is desirable to provide integrated circuits with FETs having nanowires and methods of manufacturing integrated circuits with FETs having nanowires. In addition, it is desirable to provide integrated circuits with FETs using nanowires, where the FETs are manufactured using techniques that allow for further scaling, such as the use of fins and/or replacement metal gates. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming a stack overlying a substrate. The stack includes a silicon germanium layer and a silicon layer, where the silicon germanium layer has a first germanium concentration. The stack is condensed to produce a second germanium concentration in the germanium layer, where the second germanium concentration is greater than the first germanium concentration. A fin is formed that includes the stack, and a gate is formed overlying the fin.

A method for fabricating a nanowire is provided in another embodiment. A stack is epitaxially formed over a substrate, where the stack includes a silicon germanium layer and a silicon layer, where the silicon germanium layer has a first silicon germanium layer volume. The stack is condensed to produce a second silicon germanium layer volume less than the first silicon germanium layer volume, and a nanowire is formed from the silicon germanium layer.

An integrated circuit is provided in yet another embodiment. The integrated circuit includes a fin and a gate overlying the fin. The fin includes a nanowire, where the nanowire includes germanium with a germanium concentration of from about 70 to about 90 weight percent. A nanowire insulator overlies the nanowire, where the nanowire insulator is silicon dioxide. A gate dielectric is between the fin and the gate.

BRIEF DESCRIPTION OF THE DRAWINGS

The present embodiments will hereinafter be described in conjunction with the following drawing figures, wherein like numerals denote like elements, and wherein:

FIGS. 1-12 illustrate portions of an integrated circuit and methods for its fabrication in accordance with exemplary embodiments, where:

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

According to various embodiments described herein, FETs with nanowire channels are formed from a layered stack within a fin using a replacement metal gate. Alternating layers of silicon and silicon germanium are deposited to form the stack overlying a substrate, and the stack is annealed to produce alternating layers of silicon dioxide and silicon germanium, where the concentration of germanium in the silicon germanium layers increases during the anneal. The annealed stack is formed into a fin, a replacement metal gate is formed over the fin, and a source and drain are formed. The concentrated silicon germanium layer serves as a nanowire within the fin, and the silicon dioxide forms a nanowire insulator that separates different nanowires within the fin.

Figure 1:
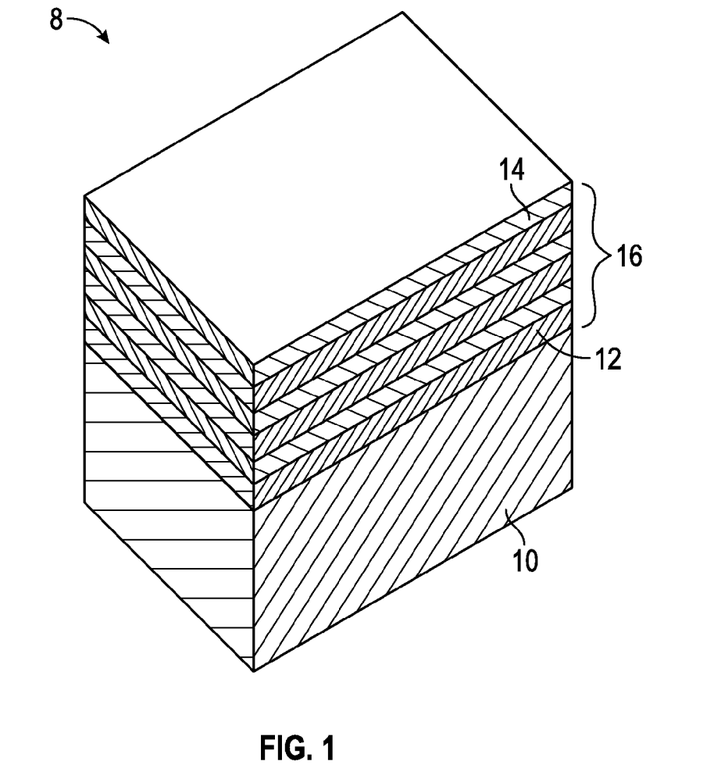
FIG. 1 is a perspective sectional view of a stack overlying a substrate in an exemplary embodiment.

In an exemplary embodiment illustrated in FIG. 1, an integrated circuit 8 is formed with a silicon germanium layer ($Si_xGe_y$ layer) 12 and a silicon layer (Si layer) 14 overlying a substrate 10. As used herein, the term "overlying" means "over" such that an intervening layer may lie between the $Si_xGe_y$ layer 12 and the substrate 10, and "on" such the $Si_xGe_y$ layer 12 physically contacts the substrate 10. Also as used herein, the term "substrate" 10 encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the substrate 10 is a monocrystalline silicon material. The silicon substrate 10 may be a bulk silicon wafer (as illustrated) or may be a thin layer of silicon on an insulating layer (commonly known as silicon-on-insulator or SOI) that, in turn, is supported by a carrier wafer.

In an exemplary embodiment, the $Si_xGe_y$ layer 12 is formed from a mixture of silicon and germanium that is deposited by epitaxial growth using a mixture of silane and germane such that the $Si_xGe_y$ layer 12 has a monocrystalline structure. Either a $Si_xGe_y$ layer 12 or a Si layer 14 may directly contact the substrate 10 as the first (or lowest) of the $Si_xGe_y$ and Si layers 12, 14, and there may be a plurality of $Si_xGe_y$ layers 12 and Si layers 14 alternately formed overlying the substrate 10. As such the $Si_xGe_y$ layer 12 and the Si layer 14 form a stack 16, where the stack 16 includes one or more alternating $Si_xGe_y$ layers 12 and Si layers 14. In an exemplary embodiment, the $Si_xGe_y$ layer 12 is from about 70 to about 80 weight percent silicon and from about 20 to about 30 weight percent germanium, or from about 75 to about 80 weight percent silicon and from about 20 to about 25 weight percent germanium. In this description, the weight percent silicon or germanium in the $Si_xGe_y$ layer 12 is based on the total weight of the $Si_xGe_y$ layer 12. In one embodiment, the $Si_xGe_y$ layer 12 is about 77 percent silicon and about 23 percent germanium. As such, the $Si_xGe_y$ layer 12 has a first germanium concentration of from about 20 to about 30 weight percent germanium, or from about 20 to about 25 weight percent germanium, or about 23 weight percent germanium in various embodiments. The $Si_xGe_y$ layer 12 may have a first $Si_xGe_y$ layer thickness of from about 3 to about 15 angstroms (Å), or from about 3 to about 10 Å, or from about 5 to about 10 Å in various embodiments. The $Si_xGe_y$ layer 12 has a first $Si_xGe_y$ layer volume that depends in part on the $Si_xGe_y$ layer thickness.

The $Si_xGe_y$ layer 12 is eventually formed into a nanowire and used as a channel for a pFET or for an nFET. In some embodiments, the $Si_xGe_y$ layer 12 may be formed to include "N" type conductivity determining ions or "P" type conductivity determining ions, but in other embodiments the $Si_xGe_y$ layer 12 does not include appreciable quantities of conductivity determining ions. Reference to the $Si_xGe_y$ layer 12 not including appreciable quantities of conductivity determining ions means the concentration of conductivity determining ions is low enough that the conductivity determining ions do not change the conductivity of the $Si_xGe_y$ layer 12 by more than about 5% from the conductivity of pure silicon germanium. "N" type conductivity determining ions (also referred to as "dopants") include arsenic or phosphorous, but antimony, other materials, or combinations thereof can also be used. "P" type conductivity determining ions primarily include boron, aluminum, gallium, and indium, but other materials could also be used.

In a similar manner, the Si layer 14 is formed by epitaxial growth with silane. In an exemplary embodiment, the Si layer 14 is about 95 weight percent or more silicon, or about 98 weight percent silicon or about 99 weight percent silicon in alternate embodiments. The Si layer 14 may have a first Si layer thickness of from about 5 to about 70 Å, or from about 10 to about 50 Å, or from about 10 to about 30 Å in various embodiments. The Si layer 14 has a first silicon layer volume related to the first Si layer thickness. The Si layer 14 may not include appreciable amounts of conductivity determining ions.

Figure 2:
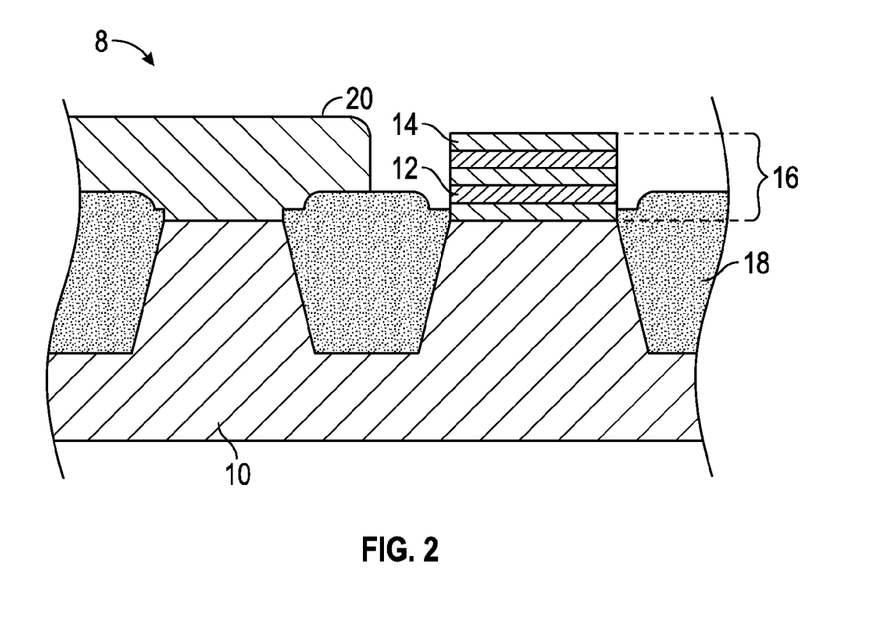
FIG. 2 is a cross-sectional view of another embodiment illustrating a portion of an integrated circuit during fabrication.

The stack 16 may be formed over the entire substrate 10 in some embodiments, and the stack 16 may be removed at locations where nanowires are not desired, such as locations for resistors, capacitors, or other electronic components that do not include nanowires. The stack 16 may be removed with a reactive ion etch using a fluorinated compound, such as silicon hexafluoride, but other etchants can be used in various embodiments. In an alternate embodiment illustrated in FIG. 2, the stack 16 is formed at desired locations overlying the substrate 10, but the stack 16 is not formed over the entire substrate 10. One or more shallow trench isolations 18 may be formed in the substrate 10 using methods and techniques well known to those skilled in the art, and a stack hard mask 20 may be formed overlying the portions of the substrate 10 where no stack 16 is to be formed. The stack hard mask 20 may be silicon nitride, which can be deposited by chemical vapor deposition using ammonia and dichlorosilane, and selected areas of the stack hard mask 20 may be covered by photoresist (not illustrated). The exposed areas of the stack hard mask 20 can then be removed, such as with a wet etch using hot phosphoric acid, so the surface of the substrate 10 is exposed where the stack 16 is to be formed and the surface of the substrate 10 is covered by the stack hard mask 20 at other locations. The stack 16 is formed by epitaxially growing alternating $Si_xGe_y$ layer(s) 12 and Si layer(s) 14, as described above. The $Si_xGe_y$ and Si layers 12, 14 grow from the exposed monocrystalline structure of the substrate 10 but not from the structure of the stack hard mask 20 or the shallow trench isolation 18.

Figure 3:
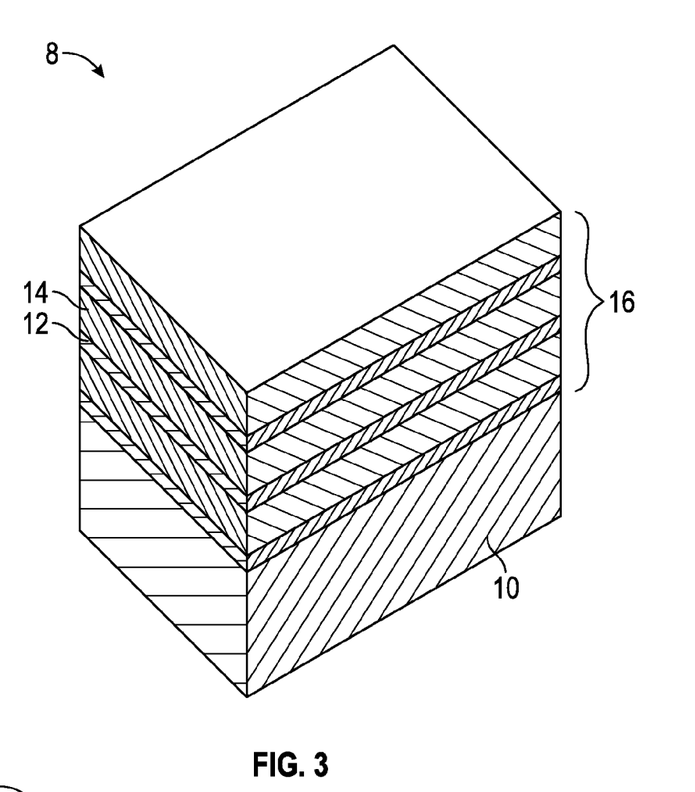
FIGS. 3, 6-8, 10, and 12 are perspective sectional views of an integrated circuit illustrating different stages of fabrication.

Referring to an exemplary embodiment in FIG. 3, the stack 16 is condensed by annealing to modify the $Si_xGe_y$ and Si layers 12, 14. The condensing process (also referred to as an anneal) involves heating the stack 16 for a certain period of time. For example, the stack 16 may be condensed at a temperature of from about 900 degrees centigrade (° C.) to about 1,100° C. for a time of from about 0.5 hours to about 1.5 hours. Lower temperatures may be used for longer periods of time, or the time can be reduced with higher temperatures. The condensation is performed in an oxygen ambient in some embodiments. During the condensation, the composition of the $Si_xGe_y$ layer 12 changes, where some of the silicon from $Si_xGe_y$ layer 12 migrates out such that the concentration of the germanium in the $Si_xGe_y$ layer 12 increases. For example, a second germanium concentration after the anneal may be from about 70 to about 90 weight percent, or from about 75 to about 85 weight percent, or from about 78 to about 82 weight percent in various embodiments. As such, the second germanium concentration after the anneal is greater than the first germanium concentration before the anneal. The $Si_xGe_y$ layer thickness decreases to a second $Si_xGe_y$ layer thickness as the silicon migrates out of the $Si_xGe_y$ layer 12 during the condensation, so the $Si_xGe_y$ layer 12 has a second $Si_xGe_y$ layer volume after the condensation that is less than the first $Si_xGe_y$ layer volume from before the condensation. For example, the second $Si_xGe_y$ layer thickness may be about 3 to about 10 Å, or about 3 to about 7 Å in various embodiments, but other thicknesses are also possible. The silicon and germanium in the $Si_xGe_y$ layer 12 is electrically conductive, so the $Si_xGe_y$ layer 12 is eventually incorporated into a FET as the nanowire.

Silicon in the Si layer 14 is oxidized to form silicon dioxide during the condensation. As mentioned above, the condensation is performed in an oxygen ambient at high temperatures, thus resulting in oxidation of the silicon in the Si layer 14. As the silicon oxidizes, the thickness of the Si layer 14 increases to a second Si layer thickness greater than the first Si layer thickness. For example, the second Si layer thickness may be from about 20 to about 100 Å, or from about 20 to about 50 Å in various embodiments, but other thicknesses are also possible. As the silicon layer thickness increases to the second silicon layer thickness, the silicon layer volume also increases to a second silicon layer volume. The second silicon layer volume after the condensation is greater than the first silicon layer volume before the anneal. Silicon from the $Si_xGe_y$ layer 12 migrates into the Si layer 14 during the anneal, and the migrating silicon is oxidized to form silicon dioxide, so the migrating silicon further increases the second silicon layer volume and the silicon layer thickness after the anneal. The silicon dioxide formed in the Si layer 14 is an electrical insulator, so the Si layer 14 can serve as a nanowire insulator that electrically separates the $Si_xGe_y$ layer 12 nanowires from each other. The nanowire insulator formed of the Si layer 14 alternates between the $Si_xGe_y$ layer(s) 12 that serves as the nanowire, so the nanowire insulator overlies and underlies the $Si_xGe_y$ layer 12 nanowire.

Figure 4:
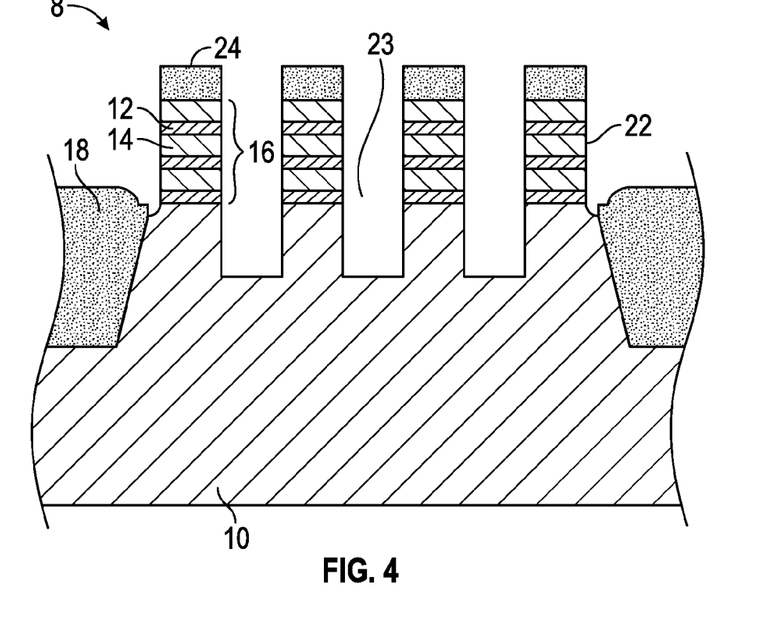
FIGS. 4 and 5 are cross-sectional views of an integrated circuit illustrating different stages of fabrication.

Reference is made to the exemplary embodiment illustrated in FIG. 4, with continuing reference to FIG. 3. The stack 16 can be formed into a fin 22, where the fin 22 may extend into the substrate 10 in some embodiments. As such, the fin 22 includes the $Si_xGe_y$ and Si layers 12, 14 of the stack 16, with a well 23 defined between adjacent fins 22. In an exemplary embodiment, a fin hard mask 24 and fin photoresist (not illustrated) are formed overlying the stack 16. The fin hard mask 24 may be silicon nitride, which can be deposited by low pressure chemical vapor deposition using ammonia and dichlorosilane, but other materials can be used in alternate embodiments. The fin photoresist and fin hard mask 24 are patterned and etched to leave the fin hard mask 24 overlying the fin 22, as understood by those skilled in the art. The stack 16 is removed to form the well 23 except for where it is protected by the fin hard mask 24 to form a fin 22 or a plurality of fins 22. The stack 16 can be removed with an anisotropic reactive ion etch using a fluorine-containing material, such as sulfur hexafluoride, but other etches are also possible. The fin 22 includes the $Si_xGe_y$ layers 12 and the Si layers 14 alternating along a height of the fin 22, and the fin 22 may extend into the substrate 10 underlying the stack 16.

Figure 5:
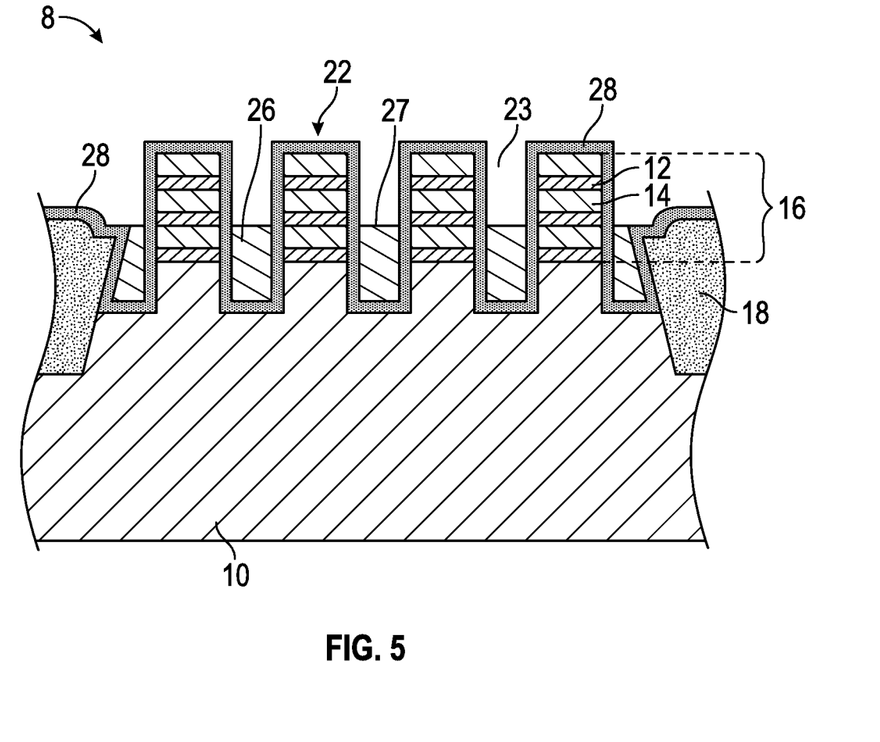

Referring to FIG. 5, with continuing reference to FIGS. 3 and 4, an interface insulating layer 28 is formed overlying the fins 22. The interface insulating layer 28 may be conformally deposited, such as by atomic layer deposition. In an exemplary embodiment, the interface insulating layer 28 is silicon nitride, which can be deposited using ammonia and dichlorosilane. A fin isolation insulator 26 is formed between adjacent fins 22 and overlying the interface insulating layer 28. The fin isolation insulator 26 is silicon oxide in some embodiments, which may be deposited by chemical vapor deposition using silane and oxygen. The fin isolation insulator 26 may be silicon nitride or other insulating materials in alternate embodiments. The fin isolation insulator 26 is recessed such that it only partially fills the wells 23 between the fins 22. In this regard, the fin isolation insulator 26 may be deposited and then planarized, such as to about a level equal to the top of the fin 22, with chemical mechanical planarization. The fin isolation insulator 26 may then be further recessed with an etchant selective to the material of the fin isolation insulator 26 over the material of the interface insulating layer 28. For example, a wet etch with dilute hydrofluoric acid removes silicon oxide preferentially to silicon nitride. The fin hard mask 24 is removed when the fin isolation insulator 26 is recessed between the fins 22.

In an exemplary embodiment, the fin isolation insulator 26 is recessed to a level above the bottom of the stack 16 such that one or more $Si_xGe_y$ layers 12 of the stack 16 closest to the substrate 10 are closer to the substrate 10 than the exposed fin isolation insulator surface 27. In alternate embodiments, the fin isolation insulator surface 27 may be recessed to a point closer to the substrate 10 than any of the $Si_xGe_y$ layers 12 in the stack 16. The fin hard mask 24 can be removed when the fin isolation insulator 26 is recessed to the desired level, such as with an etchant selective to silicon nitride over silicon oxide. A wet etch with hot phosphoric acid is selective to silicon nitride, for example.

Figure 6:
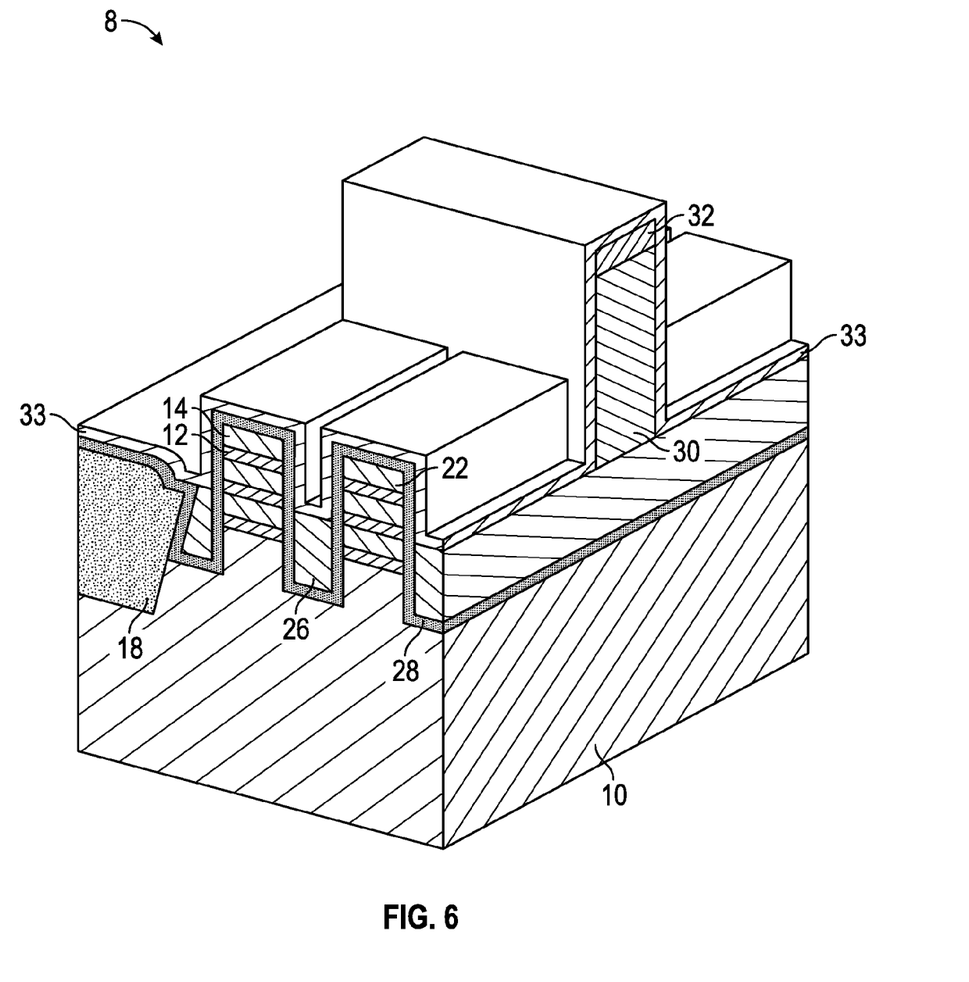

A dummy gate 30 is formed overlying the fins 22, adjacent to a sidewall of the fins 22, and overlying the fin isolation insulator 26, as illustrated in FIG. 6. In an exemplary embodiment, the dummy gate 30 is formed by depositing polysilicon overlying the fins 22, the substrate 10, the interface insulating layer 28, and the fin isolation insulator 26. Polysilicon can be deposited by low pressure chemical vapor deposition in a silane ambient. A dummy gate hard mask 32 is then formed overlying the polysilicon, and patterned with photoresist (not illustrated) to leave the dummy gate hard mask 32 overlying the portion of the polysilicon to form the dummy gate 30. The dummy gate hard mask 32 is silicon nitride in an exemplary embodiment, but other materials can also be used. The polysilicon is then selectively etched anisotropically to leave the dummy gate 30 overlying a central portion of the fins 22, as well as overlying a portion of the fin isolation insulator 26, as illustrated. A reactive ion etch with hydrogen bromide can be used, but other etchants are also effective, as understood by those skilled in the art. A spacer liner 33 may be formed overlying the dummy gate 30, the fins 22, and other portions of the integrated circuit 8. The spacer liner 33 includes silicon dioxide in an exemplary embodiment, which may be deposited as described above.

Figure 7:
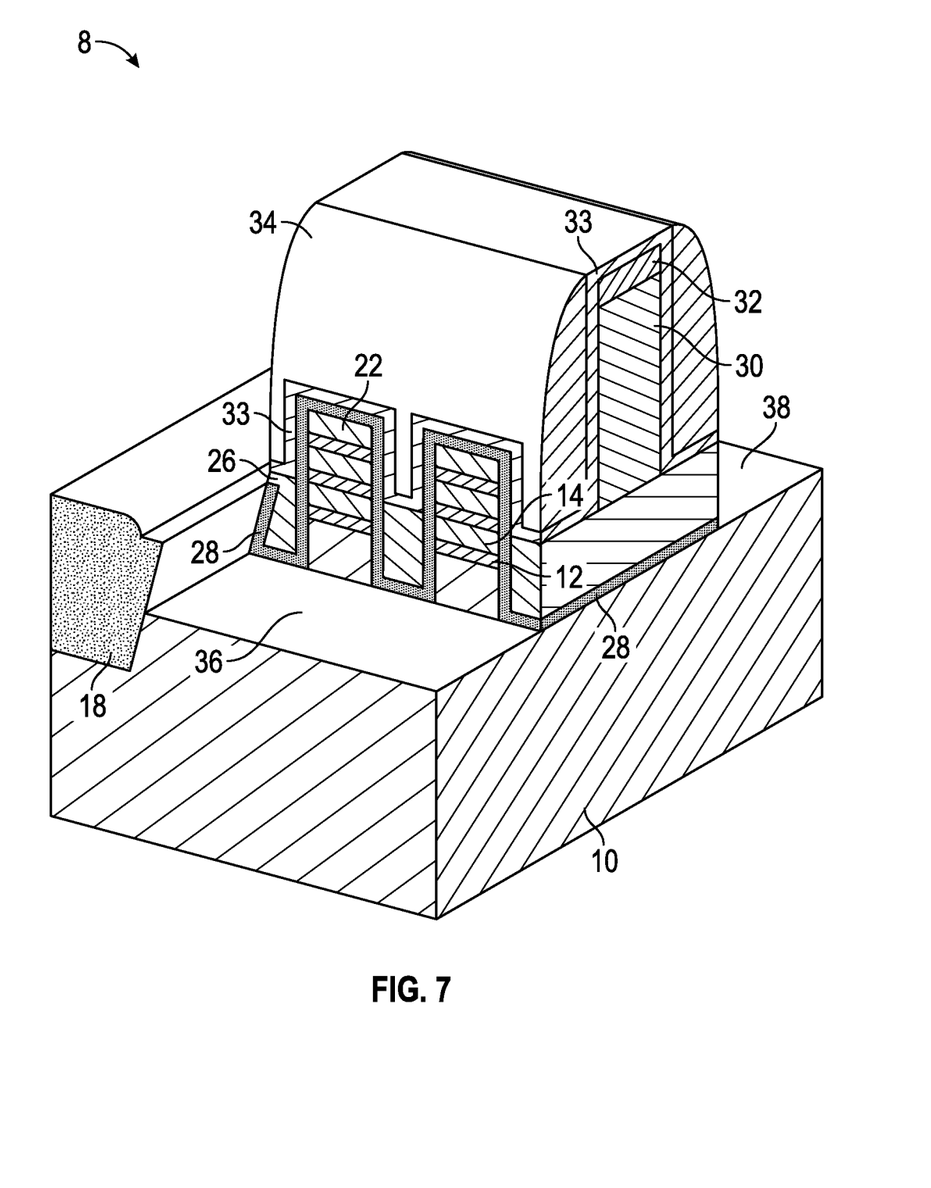

Reference is made to the exemplary embodiment illustrated in FIG. 7, with continuing reference to FIG. 6. Spacers 34 are formed on opposite sides and adjacent to the dummy gate 30. The spacers 34 can be formed by depositing silicon nitride overlying the dummy gate 30, the dummy gate hard mask 32, the fins 22, the fin isolation insulator 26, and the interface insulating layer 28, and then anisotropically etching the silicon nitride to leave spacers 34 next to vertical side surfaces of the dummy gate 30. A dry plasma etch with hydrogen and nitrogen trifluoride can be used to anisotropically remove the silicon nitride. The silicon nitride anisotropic etch is stopped before the dummy gate hard mask 32 is etched from over the dummy gate 30. In an embodiment with a silicon dioxide spacer liner 33 and a silicon nitride interface insulating layer 28, the spacer liner 33 may protect the interface insulating layer 28 from the nitride etch. In some embodiments, the ends of the fin 22 that extend beyond the spacers 34 are removed to form a source cavity 36 and a drain cavity 38 (the drain cavity 38 is hidden by the dummy gate 30 and the spacers 34, but is a mirror reflection of the illustrated source cavity 36). The ends of the fin 22 are removed with an anisotropic etchant that is selective to silicon oxide and silicon germanium over silicon nitride, and the exposed portion of the interface insulating layer 28 is removed from over the fin isolation insulator 26. A dilute hydrofluoric acid wet etch can be used to remove the silicon oxide layers. The silicon germanium in the $Si_xGe_y$ layers 12 can be removed with an anisotropic reactive ion etch using an etchant such as sulfur fluoride or nitrogen trifluoride. In an exemplary embodiment, the source and drain cavities 36, 38 extend from one shallow trench isolation 18 to an adjacent shallow trench isolation 18, where the shallow trench isolation 18 on the right hand side of FIG. 7 and the following perspective views not illustrated to better show the structure.

Figure 8:
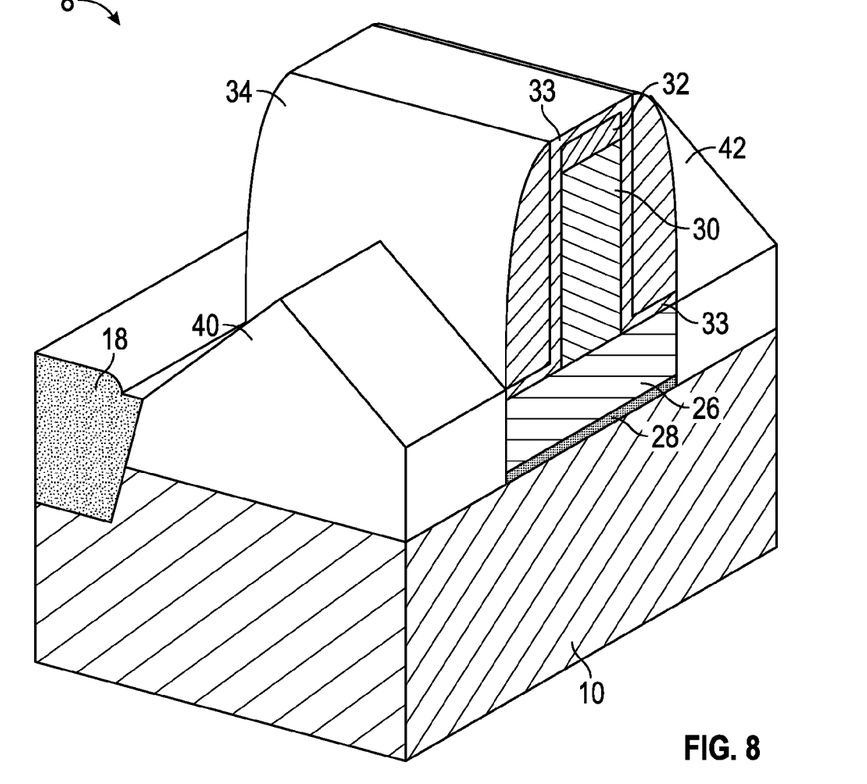
Figure 9:
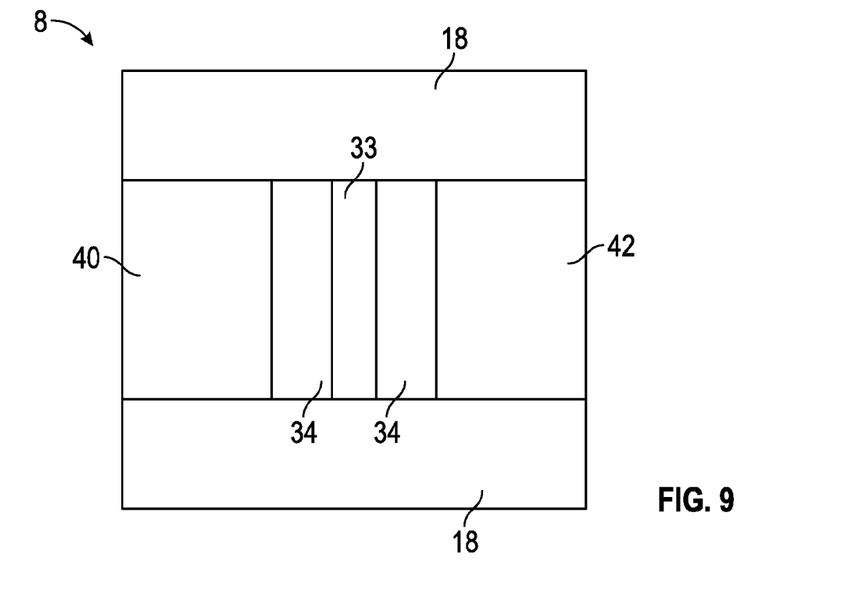
FIG. 9 is a plan view of an integrated circuit illustrating a stage of fabrication.

A source 40 and drain 42 are then formed in the source cavity 36 and the drain cavity 38, as illustrated in the exemplary embodiment in FIGS. 8 and 9, with continuing reference to FIG. 7, where FIG. 9 is a plan view. The source 40 and drain 42 are regrown epitaxially, so the source 40 and drain 42 grow from the exposed monocrystalline silicon (or silicon germanium) within the source and drain cavities 36, 38, respectively. However, the source 40 and drain 42 do not epitaxially grow from the silicon nitride or silicon oxide exposed in areas other than the source and drain cavities 36, 38. The source 40 and drain 42 may be formed of silicon germanium, such that the source 40 and drain 42 impart a compressive strain on the nanowires, where the nanowires are the $Si_xGe_y$ layer 12 remaining in the fin 22 underlying the dummy gate 30 and the spacers 34. Alternatively, the source 40 and drain 42 may be formed of silicon carbon to impart an expansive strain on the $Si_xGe_y$ layer 12. The source 40 and drain 42 are formed in contact with the fin 22, so the source 40 and drain 42 are electrically coupled to the electrically conducive $Si_xGe_y$ layer 12 that serves as the nanowire. For a pMOS, the source 40 and drain 42 may include $Si_xGe_{(1-x)}$ where X varies from about 0.6 to about 0.8, but other concentrations or compositions are also possible. For pMOS, the source 40 and drain 42 may include silicon carbon with about 2 to about 4 weight percent carbon, but the source 40 and drain 42 may include high purity silicon or other compositions in alternate embodiments.

In some embodiments, the source 40 and drain 42 are epitaxially grown with conductivity imparting ions appropriate for the FET being formed. However, in other embodiments the source 40 and drain 42 are implanted with conductivity imparting ions, as understood by those skilled in the art. The conductivity imparting ions can be sequentially implanted in the source 40 and drain 42 for nFETs and pFETs, so each type of FET has the appropriate type of conductivity imparting ions in the source 40 and drain 42. Alternatively, the source 40 and drain 42 can be sequentially grown with the conductivity imparting ions, so each type of FET has the appropriate type of conductivity imparting ions. In some embodiments, the source 40 and drain 42 for nFETs are formed of silicon with very little or no germanium, and the source 40 and drain 42 may include carbon to induce an expansive strain on the $Si_xGe_y$ layer 12. The source 40 and drain 42 for pFETs may include silicon and germanium to impart a compressive strain on the $Si_xGe_y$ layer 12, where the source 40 and drain 42 for nFETs and for pFETs are sequentially formed, as understood by those skilled in the art. For example, the source 40 and drain 42 for nFETs may include about 95 weight percent silicon, or about 98 weight percent silicon, or about 99 weight percent silicon in various embodiments. Alternatively, the source 40 and drain 42 for an nFET may be formed from silicon and germanium, and then relaxed.

Figure 10:
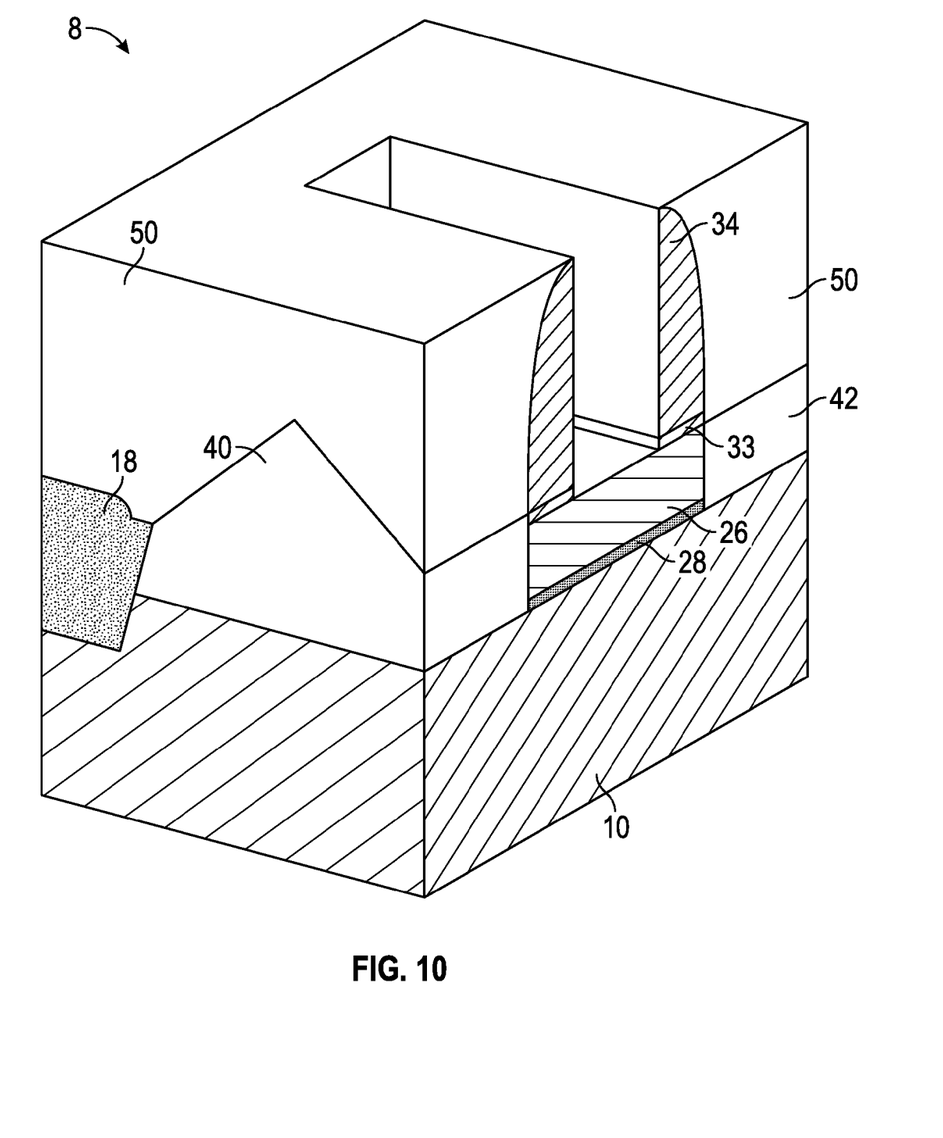

Reference is made to the exemplary embodiment illustrated in FIG. 10, with continuing reference to FIGS. 8 and 9. An insulating layer 50 is formed between adjacent dummy gates 30 and overlying the fins 22, the fin isolation insulator 26, and the source 40 and drain 42. The insulating layer 50 may be formed by depositing a silicon and nitrogen containing film using a flowable chemical vapor deposition (FCVD) process, but other materials or processes are used in alternate embodiments. In an exemplary embodiment, the FCVD is a plasma chemical vapor deposition process that can use a low carbon or carbon-free silicon containing precursor that includes silicon along with a nitrogen containing precursor. The silicon precursor may be trisilylamine, disilylamine, monosilylamine, silane, or other precursors, and the nitrogen containing precursor may be ammonia, nitrogen gas, or other compounds. The FCVD material can be converted to silicon oxide by infusion with water followed by a steam anneal, which is optionally followed by a dry anneal to densify the silicon oxide. Chemical mechanical planarization then recesses the insulating layer 50 to a level about even with the top of the dummy gate hard mask 32.

The dummy gate 30 is removed after the insulating layer 50 is formed, but the spacers 34 are retained. In an exemplary embodiment, the dummy gate 30 is removed by first etching the dummy gate hard mask 32 with a hot phosphoric acid solution, and then selectively etching the polysilicon dummy gate 30, such as with a reactive ion etch using hydrogen bromide, but other etch chemistries can also be used. The spacer liner 33 may be completely or partially removed with a selective etch in different embodiments. For example, in embodiments where the spacer liner 33 includes silicon dioxide, a wet etch with dilute hydrofluoric acid can be used, but other etchants are also possible. This step may be carefully optimized to terminate the etch when the desired portions of the spacer liner 33 are removed. The spacers 34 are somewhat protected by the insulating layer 50. Therefore, the spacers 34 are largely left in place from the etch of the dummy gate hard mask 32, but some recessing of the spacers 34 may occur. Removal of the dummy gate 30 exposes the portion of the fin 22 and the interface insulating layer 28 that was covered by the dummy gate 30. The interface insulating layer 28 protects the fin 22 from unintended etching during the removal of the dummy gate 30. The insulating layer 50 and the spacer 34 cover the remaining portion of the fin 22, the source 40 and drain 42, and the fin isolation insulator 26.

Figure 11:
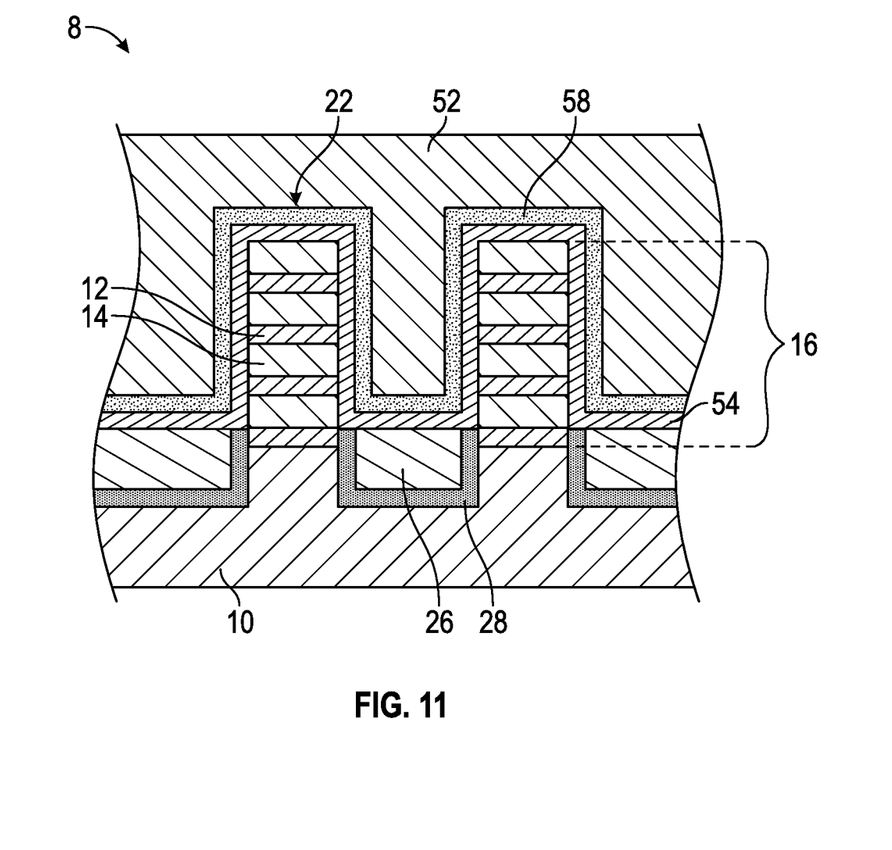
FIG. 11 is a cross-sectional view of an integrated circuit taken along plane 11-11 from FIG. 10.
Figure 12:
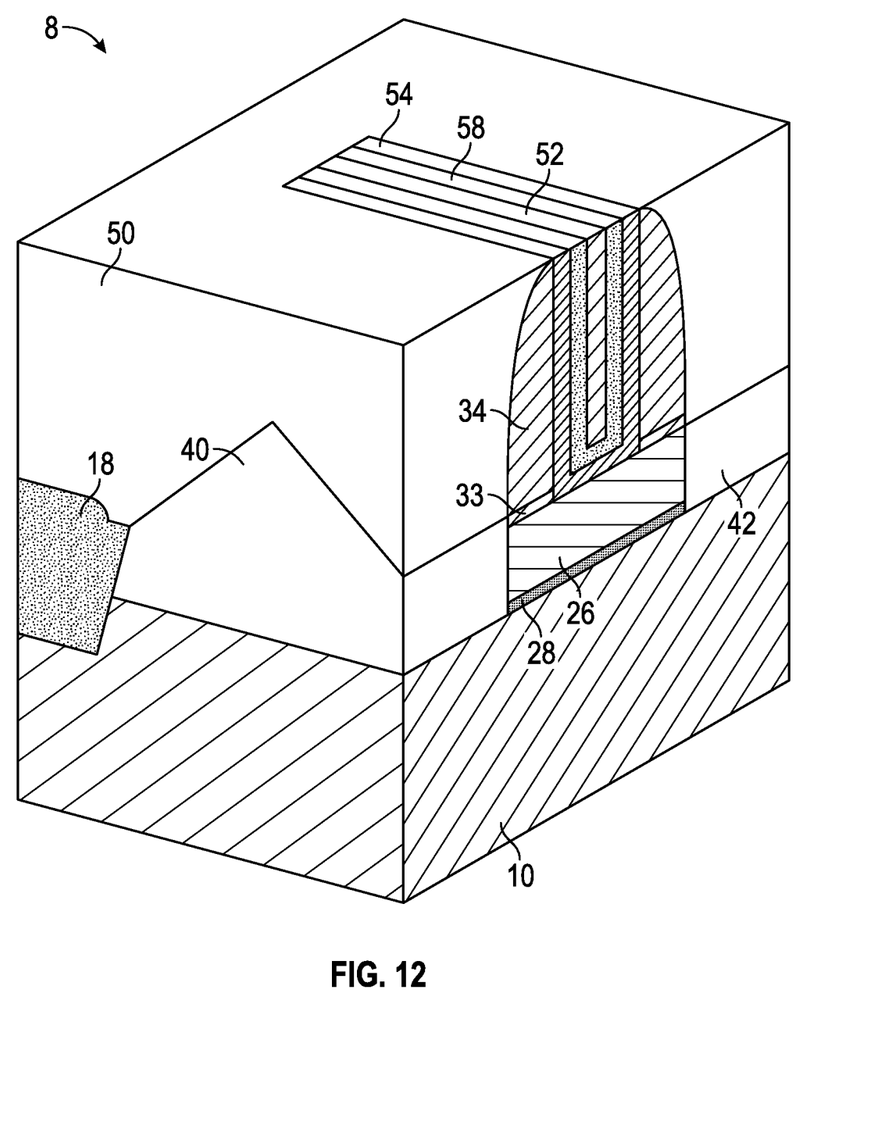

Referring to FIGS. 11 and 12, with continuing reference to FIGS. 9 and 10, a replacement metal gate 52 is formed in the space where the dummy gate 30 was located. FIG. 11 is a cross sectional view along plane 11-11 from FIG. 10. A gate dielectric layer 54 is formed overlying fin 22 and the fin isolation insulator 26. The gate dielectric layer 54 may be a high K dielectric material in some embodiments. As used herein, a "high K dielectric" is a dielectric material with a dielectric constant (K) of about 3.7 or greater, where K is the ratio of a material's permittivity $\in$ to the permittivity of vacuum ∈o, so k=∈/∈o. Since the dielectric constant is a ratio of two similar quantities, it is dimensionless. The gate dielectric layer 54 may be a wide variety of materials, such as hafnium oxide or zirconium silicate. The gate dielectric layer 54 is formed by atomic layer deposition in an exemplary embodiment. A work function layer 58 may be formed overlying the gate dielectric layer 54, where the work function layer 58 is formed from appropriate materials for the type of FET being formed.

A replacement metal gate 52 is then formed in the space previously occupied by the dummy gate 30, but other types of gates are used in alternate embodiments. As such, the replacement metal gate 52 is positioned between the spacers 34, and the gate dielectric layer 54 is positioned between the replacement metal gate 52 and the interface insulating layer 28. The replacement metal gate 52 may be tungsten, aluminum, or other metals in various embodiments. For example, an aluminum replacement metal gate 52 may be deposited by atomic layer deposition using triisobutylaluminium. Overburden from the deposition of the replacement metal gate 52 may be removed by chemical mechanical planarization. The replacement metal gate 52 forms a FET 56 with nanowires (formed from the $Si_xGe_y$ layers 12) and the other components described above. The number of $Si_xGe_y$ layers 12 in the stack 16 determines the number of nanowires in the FET 56, and the size and number of nanowires determines the current in the FET 56. The FET 56 can then be incorporated into an integrated circuit 8 using methods and techniques well known to those skilled in the art.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of forming an integrated circuit comprising:
   forming a stack overlying a substrate, wherein the stack comprises a silicon germanium layer and a silicon layer, wherein the silicon germanium layer has a first germanium concentration;
   condensing the stack to produce a second germanium concentration in the silicon germanium layer, wherein the second germanium concentration is greater than the first germanium concentration;
   forming a fin that includes the stack; and
   forming a gate overlying the fin.

2. The method of claim 1 wherein condensing the stack comprises producing the second germanium concentration of from about 70 weight percent to about 90 weight percent germanium based on the total weight of the silicon germanium layer.

3. The method of claim 2 wherein condensing the stack comprises increasing a germanium concentration from the first germanium concentration of about 20 to about 50 weight percent based on the total weight of the silicon germanium layer to the second germanium concentration.

4. The method of claim 1 wherein condensing the stack comprises heating the stack to about 900 to about 1,100 degrees centigrade for about 0.5 to about 1.5 hours.

5. The method of claim 1 wherein forming the gate overlying the fin comprises forming a replacement metal gate overlying the fin; the method further comprising
   forming a source and a drain electrically coupled to the silicon germanium layer in the fin.

6. The method of claim 5 further comprising:
   forming an interface insulating layer before forming the replacement metal gate, wherein the interface insulating layer is positioned between the fin and the replacement metal gate.

7. The method of claim 6 further comprising:
   forming a gate dielectric layer overlying the interface insulating layer such that the gate dielectric layer is positioned between the interface insulating layer and the replacement metal gate.

8. The method of claim 1 further comprising:
   forming a nanowire insulator from the silicon layer.

9. The method of claim 8 wherein forming the nanowire insulator comprises oxidizing silicon in the silicon layer to form silicon dioxide.

10. The method of claim 1 wherein condensing the stack comprises condensing the stack in an oxygen ambient.

11. The method of claim 1 further comprising:
    inducing a compressive strain on the silicon germanium layer.

12. A method of fabricating a nanowire comprising:
    epitaxially forming a stack over a substrate, wherein the stack comprises a silicon germanium layer and a silicon layer, and wherein the silicon germanium layer has a first silicon germanium layer volume;
    condensing the stack to produce a second silicon germanium layer volume less than the first silicon germanium layer volume; and
    forming a nanowire from the silicon germanium layer.

13. The method of claim 12 wherein condensing the stack comprises changing a first germanium concentration before condensing the stack to a second germanium concentration after condensing the stack in the silicon germanium layer, wherein the first germanium concentration is from about 20 to about 50 weight percent germanium, and the second germanium concentration is from about 70 weight percent to about 90 weight percent germanium.

14. The method of claim 12 wherein condensing the stack comprises:
    migrating silicon from the silicon germanium layer into the silicon layer.

15. The method of claim 14 wherein the silicon layer has a first silicon layer volume before condensing the stack, and wherein condensing the stack comprises:
    producing a second silicon layer volume after condensing the stack that is larger than the first silicon layer volume.

16. The method of claim 12 further comprising:
    forming a fin, wherein the fin comprises the nanowire formed from the silicon germanium layer and the fin comprises the silicon layer, wherein the silicon layer comprises silicon dioxide after condensing the stack; and
    forming a replacement metal gate overlying the fin.

17. The method of claim 16 further comprising:
    forming an interface insulating layer overlying the fin; and
    forming a gate dielectric layer overlying the interface insulating layer such that the gate dielectric layer is positioned between the interface insulating layer and the replacement metal gate.

18. The method of claim 12 wherein condensing the stack comprises condensing the stack at a temperature of from about 900 to about 1,100 degrees centigrade.

19. The method of claim 12 further comprising:
  inducing a compressive strain on the nanowire.

* * * * *